United States Patent
Ho et al.

(10) Patent No.: US 12,491,697 B2
(45) Date of Patent: Dec. 9, 2025

(54) ADJUSTING DEVICE

(71) Applicant: Innolux Corporation, Miao-Li County (TW)

(72) Inventors: Chia-Chi Ho, Miao-Li County (TW);
Yi-Hung Lin, Miao-Li County (TW);
Hsiu-Yi Tsai, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 614 days.

(21) Appl. No.: 17/683,370

(22) Filed: Mar. 1, 2022

(65) Prior Publication Data
US 2022/0305754 A1 Sep. 29, 2022

(30) Foreign Application Priority Data
Mar. 24, 2021 (CN) .......................... 202110314313.4

(51) Int. Cl.
*B32B 3/02* (2006.01)
*B32B 3/08* (2006.01)
(Continued)

(52) U.S. Cl.
CPC .................. *B32B 3/30* (2013.01); *B32B 3/02* (2013.01); *B32B 3/266* (2013.01); *B32B 7/12* (2013.01);
(Continued)

(58) Field of Classification Search
None
See application file for complete search history.

(56) References Cited

U.S. PATENT DOCUMENTS 6,392,735 B1 * 5/2002 Tani ...................... G02F 1/1339
349/155
6,836,301 B1 * 12/2004 Kohtaka ............... G02F 1/1345
257/59
(Continued)

FOREIGN PATENT DOCUMENTS

CN 1560689 A * 1/2005
CN 101697043 A * 4/2010
(Continued)

OTHER PUBLICATIONS

Machine Translation of CN-111552129-A, Aug. 2020 (Year: 2020).*
(Continued)

*Primary Examiner* — Jeffrey A Vonch
(74) *Attorney, Agent, or Firm* — JCIPRNET

(57) ABSTRACT

The disclosure provides an adjusting device having an active region and a peripheral region adjacent to the active region. The adjusting device includes a first substrate, a first conducting layer, a first insulating layer, a second conducting layer, a second insulating layer, and a sealant layer. The first insulating layer is disposed on the first conducting layer and includes a first opening disposed in the peripheral region. The second conducting layer is disposed on the first conducting layer and electrically connected to the first conducting layer through the first opening. The second insulating layer includes multiple first protruding structures disposed in the peripheral region and on the first insulating layer. The sealant layer is disposed in the peripheral region and on the second insulating layer. The first opening is disposed between two of the first protruding structures.

20 Claims, 12 Drawing Sheets

(51) Int. Cl.
    *B32B 3/22*     (2006.01)
    *B32B 3/24*     (2006.01)
    *B32B 3/26*     (2006.01)
    *B32B 3/30*     (2006.01)
    *B32B 7/12*     (2006.01)
    *B32B 3/06*     (2006.01)
    *B32B 9/04*     (2006.01)
    *G02F 1/1333*   (2006.01)
    *G02F 1/1339*   (2006.01)
    *H01Q 1/38*     (2006.01)
    *H01Q 1/50*     (2006.01)
    *H01Q 3/44*     (2006.01)
    *H01Q 21/06*    (2006.01)
    *H10K 59/80*    (2023.01)

(52) U.S. Cl.
    CPC . *B32B 3/06* (2013.01); *B32B 3/08* (2013.01); *B32B 3/085* (2013.01); *B32B 3/22* (2013.01); *B32B 9/041* (2013.01); *B32B 9/045* (2013.01); *B32B 2307/202* (2013.01); *B32B 2307/206* (2013.01); *B32B 2457/00* (2013.01); *G02F 1/133388* (2021.01); *G02F 1/1339* (2013.01); *H01Q 1/38* (2013.01); *H01Q 1/50* (2013.01); *H01Q 3/44* (2013.01); *H01Q 21/061* (2013.01); *H10K 59/8722* (2023.02); *Y10T 428/24331* (2015.01); *Y10T 428/24339* (2015.01); *Y10T 428/24521* (2015.01); *Y10T 428/24537* (2015.01); *Y10T 428/2457* (2015.01)

(56) References Cited

U.S. PATENT DOCUMENTS

| | | | | |
|---|---|---|---|---|
| 9,466,547 B1* | 10/2016 | Arvin | | H01L 21/4853 |
| 2002/0030769 A1* | 3/2002 | Bae | | G02F 1/136227 349/43 |
| 2003/0112387 A1* | 6/2003 | Lim | | G02F 1/1339 349/110 |
| 2004/0125315 A1* | 7/2004 | Park | | G02F 1/1339 349/153 |
| 2004/0150776 A1* | 8/2004 | Kim | | G02F 1/1339 349/138 |
| 2006/0001789 A1* | 1/2006 | Ahn | | G02F 1/136286 349/42 |
| 2006/0139556 A1* | 6/2006 | Ahn | | G02F 1/1368 349/153 |
| 2006/0232740 A1* | 10/2006 | Shigemura | | G02F 1/1339 349/153 |
| 2007/0097306 A1* | 5/2007 | Jung | | G02F 1/1345 349/143 |
| 2007/0108623 A1* | 5/2007 | Jao | | H01L 23/562 257/737 |
| 2007/0139600 A1* | 6/2007 | Lee | | G02F 1/13454 349/153 |
| 2007/0279565 A1* | 12/2007 | Iwato | | G02F 1/133711 349/138 |
| 2007/0291216 A1* | 12/2007 | Chan | | G02F 1/1339 349/110 |
| 2008/0018848 A1* | 1/2008 | Iwato | | G02F 1/133711 349/149 |
| 2009/0066903 A1* | 3/2009 | Yoshida | | G02F 1/1339 445/25 |
| 2009/0279011 A1* | 11/2009 | Baek | | H10D 86/60 438/30 |
| 2009/0290085 A1* | 11/2009 | Chang | | G02F 1/133345 349/187 |
| 2010/0079718 A1* | 4/2010 | Sekiya | | G02F 1/133512 349/153 |
| 2010/0110022 A1* | 5/2010 | Chen | | G06F 3/0412 345/173 |
| 2010/0149477 A1* | 6/2010 | Nagami | | G02F 1/13394 349/138 |
| 2010/0157231 A1* | 6/2010 | Jung | | G02F 1/1345 257/E33.068 |
| 2010/0181902 A1* | 7/2010 | Kita | | G02F 1/1341 313/504 |
| 2011/0090445 A1* | 4/2011 | Kim | | G02F 1/1339 349/139 |
| 2011/0134352 A1* | 6/2011 | Nakagawa | | G02F 1/1345 349/43 |
| 2011/0205473 A1* | 8/2011 | Oda | | G02F 1/1341 349/104 |
| 2012/0033162 A1* | 2/2012 | Ahn | | G02F 1/1339 445/24 |
| 2012/0113365 A1* | 5/2012 | Song | | G02F 1/1339 438/34 |
| 2012/0194772 A1* | 8/2012 | Moriwaki | | G09F 9/30 349/138 |
| 2012/0229712 A1* | 9/2012 | Yoshida | | G02F 1/1339 348/E3.016 |
| 2012/0319574 A1* | 12/2012 | Kim | | H05B 33/04 313/512 |
| 2013/0027648 A1* | 1/2013 | Moriwaki | | G02F 1/136286 349/138 |
| 2013/0050605 A1* | 2/2013 | Moriwaki | | G02F 1/1339 445/25 |
| 2013/0093657 A1* | 4/2013 | Song | | G02F 1/13306 345/84 |
| 2013/0308082 A1* | 11/2013 | Liu | | G02F 1/1339 349/153 |
| 2014/0022478 A1* | 1/2014 | Kim | | G02F 1/13394 349/122 |
| 2014/0043574 A1* | 2/2014 | Ichimura | | G02F 1/1339 349/138 |
| 2014/0055735 A1* | 2/2014 | Oono | | G02F 1/13394 349/153 |
| 2014/0176886 A1* | 6/2014 | Yoshida | | G02F 1/1339 349/110 |
| 2014/0362333 A1* | 12/2014 | Oono | | G02F 1/133345 349/138 |
| 2015/0001501 A1* | 1/2015 | Cho | | H10K 59/131 257/40 |
| 2015/0036093 A1* | 2/2015 | Matsuura | | G02F 1/1339 445/25 |
| 2015/0060790 A1* | 3/2015 | Kim | | H10K 59/8722 257/40 |
| 2015/0060893 A1* | 3/2015 | Cho | | H10K 50/8428 438/26 |
| 2015/0084498 A1* | 3/2015 | Choi | | H10K 50/8426 313/504 |
| 2015/0108438 A1* | 4/2015 | Kim | | H10K 59/131 257/40 |
| 2015/0226989 A1* | 8/2015 | Lee | | G02F 1/1337 349/47 |
| 2015/0286080 A1* | 10/2015 | Sumita | | G02F 1/1339 349/153 |
| 2015/0301370 A1* | 10/2015 | Moriwaki | | G02F 1/1339 349/42 |
| 2016/0011445 A1* | 1/2016 | Chen | | G02F 1/1337 349/110 |
| 2016/0077376 A1* | 3/2016 | Lee | | G02F 1/133512 349/110 |
| 2016/0091742 A1* | 3/2016 | Chang | | H10D 86/451 257/43 |
| 2016/0111677 A1* | 4/2016 | Hong | | H10K 59/8722 257/40 |
| 2016/0154287 A1* | 6/2016 | Lee | | G02F 1/1345 349/139 |
| 2016/0202514 A1* | 7/2016 | Li | | G02F 1/13394 349/153 |
| 2017/0017109 A1* | 1/2017 | Park | | G02F 1/1339 |
| 2017/0018603 A1* | 1/2017 | An | | H10K 59/8722 |
| 2017/0077192 A1* | 3/2017 | Jang | | H10K 50/8426 |
| 2017/0155080 A1* | 6/2017 | Jo | | H10K 59/8722 |
| 2017/0250199 A1* | 8/2017 | Odaka | | H10D 86/60 |
| 2017/0299916 A1* | 10/2017 | Kobayashi | | G02F 1/13439 |

(56) References Cited

U.S. PATENT DOCUMENTS

| | | | |
|---|---|---|---|
| 2018/0120604 A1* | 5/2018 | Seok | G02F 1/1345 |
| 2018/0138594 A1* | 5/2018 | Orui | H01Q 21/0012 |
| 2018/0157132 A1* | 6/2018 | Shim | G02F 1/13394 |
| 2018/0307071 A1* | 10/2018 | Chen | G02F 1/133514 |
| 2018/0314097 A1* | 11/2018 | Kiyota | G02F 1/13394 |
| 2018/0331320 A1* | 11/2018 | Su | H10K 50/844 |
| 2019/0121180 A1* | 4/2019 | Ohashi | G06F 3/0412 |
| 2019/0288008 A1* | 9/2019 | Park | G09G 3/3266 |
| 2020/0103715 A1* | 4/2020 | Yang | G02F 1/136209 |
| 2020/0110295 A1* | 4/2020 | Huang | G02F 1/134309 |
| 2020/0183205 A1* | 6/2020 | Chen | G02F 1/1339 |
| 2020/0183213 A1* | 6/2020 | Wu | G02F 1/1339 |
| 2020/0396835 A1* | 12/2020 | Liu | H05K 1/113 |
| 2021/0055583 A1* | 2/2021 | Song | G02F 1/1339 |
| 2021/0181558 A1* | 6/2021 | Nie | G02F 1/1339 |
| 2021/0223587 A1* | 7/2021 | Cao | G02F 1/1339 |
| 2021/0257416 A1* | 8/2021 | Sun | H10K 71/00 |
| 2021/0333583 A1* | 10/2021 | Wang | G02F 1/1339 |
| 2022/0091449 A1* | 3/2022 | Wang | G02F 1/0107 |

FOREIGN PATENT DOCUMENTS

| | | | | |
|---|---|---|---|---|
| CN | 101699335 A | * | 4/2010 | |
| CN | 101706630 A | * | 5/2010 | |
| CN | 201673348 U | * | 12/2010 | |
| CN | 102236208 A | * | 11/2011 | |
| CN | 102262319 A | * | 11/2011 | |
| CN | 102314026 A | * | 1/2012 | |
| CN | 202433650 U | * | 9/2012 | |
| CN | 102830564 A | * | 12/2012 | |
| CN | 102854664 | | 1/2013 | |
| CN | 102854664 A | * | 1/2013 | G02F 1/1333 |
| CN | 103064223 A | * | 4/2013 | |
| CN | 103278978 A | * | 9/2013 | |
| CN | 203287657 U | * | 11/2013 | |
| CN | 203337962 U | * | 12/2013 | |
| CN | 103533795 A | * | 1/2014 | |
| CN | 103838027 A | * | 6/2014 | |
| CN | 103869512 A | * | 6/2014 | |
| CN | 103941460 A | * | 7/2014 | G03F 7/0007 |
| CN | 103941491 A | * | 7/2014 | |
| CN | 204116768 U | * | 1/2015 | |
| CN | 104460154 A | * | 3/2015 | H10D 86/60 |
| CN | 105093759 A | * | 11/2015 | G02F 1/1339 |
| CN | 105158986 A | * | 12/2015 | G02F 1/1345 |
| CN | 106019727 A | * | 10/2016 | G02F 1/1339 |
| CN | 106226958 A | * | 12/2016 | G02F 1/1333 |
| CN | 205844685 U | * | 12/2016 | |
| CN | 106444183 A | * | 2/2017 | G02F 1/133308 |
| CN | 106556946 A | * | 4/2017 | G02F 1/1339 |
| CN | 107024809 A | * | 8/2017 | G02F 1/134309 |
| CN | 107085323 A | * | 8/2017 | G02F 1/1333 |
| CN | 107170792 A | * | 9/2017 | H10K 77/111 |
| CN | 107238982 A | * | 10/2017 | G02F 1/1339 |
| CN | 107272270 A | * | 10/2017 | G02F 1/1339 |
| CN | 207134067 U | * | 3/2018 | |
| CN | 207366901 U | * | 5/2018 | |
| CN | 108445686 A | * | 8/2018 | G02F 1/136227 |
| CN | 108828845 A | * | 11/2018 | G02F 1/133553 |
| CN | 108873494 A | * | 11/2018 | G02F 1/1339 |
| CN | 109061953 A | * | 12/2018 | G02F 1/1339 |
| CN | 109119762 | | 1/2019 | |
| CN | 109541856 A | * | 3/2019 | G02F 1/1339 |
| CN | 109728194 A | * | 5/2019 | |
| CN | 109888126 A | * | 6/2019 | |
| CN | 110187570 A | * | 8/2019 | G02F 1/133514 |
| CN | 110634928 A | * | 12/2019 | H10K 59/60 |
| CN | 209842296 U | * | 12/2019 | |
| CN | 110703521 A | * | 1/2020 | G02F 1/1345 |
| CN | 110967861 A | * | 4/2020 | G02F 1/133512 |
| CN | 210348146 U | | 4/2020 | |
| CN | 111190299 A | * | 5/2020 | G02F 1/13394 |
| CN | 111308816 A | * | 6/2020 | G02F 1/1362 |
| CN | 111463361 A | * | 7/2020 | H10K 50/84 |
| CN | 111552129 A | * | 8/2020 | G02F 1/1339 |
| JP | 09033933 A | * | 2/1997 | |
| JP | 09244055 A | * | 9/1997 | |
| JP | 2002250926 A | * | 9/2002 | |
| JP | 2006119667 A | * | 5/2006 | |
| JP | 2006209089 A | * | 8/2006 | |
| JP | 2007047507 A | * | 2/2007 | |
| JP | 2007121687 A | * | 5/2007 | G02F 1/1345 |
| JP | 2010152001 A | * | 7/2010 | |
| KR | 20040024918 A | * | 3/2004 | |
| KR | 20070002748 A | * | 1/2007 | G02F 1/133345 |
| KR | 2009117148 A | * | 11/2009 | |
| KR | 20110067261 A | * | 6/2011 | G02F 1/136286 |
| KR | 20110076654 A | * | 7/2011 | G02F 1/13439 |
| KR | 20150042622 A | * | 4/2015 | H10K 71/00 |
| KR | 2017073878 A | * | 6/2017 | G02F 1/133 |
| TW | 201031981 | | 9/2010 | |
| TW | I413041 | | 10/2013 | |
| WO | WO-2011108642 A1 | * | 9/2011 | G02F 1/1341 |
| WO | WO-2013044530 A1 | * | 4/2013 | G02F 1/1345 |
| WO | WO-2013080734 A1 | * | 6/2013 | G02F 1/1345 |
| WO | WO-2017061526 A1 | * | 4/2017 | H10D 86/481 |
| WO | WO-2017061527 A1 | * | 4/2017 | G09G 3/3614 |
| WO | WO-2018030279 A1 | * | 2/2018 | H01Q 19/10 |
| WO | WO-2018079350 A1 | * | 5/2018 | H01Q 21/20 |
| WO | WO-2020177600 A1 | * | 9/2020 | H10K 77/00 |
| WO | WO-2020249009 A1 | * | 12/2020 | G02F 1/133514 |

OTHER PUBLICATIONS

Machine Translation of KR20090117148A, Nov. 2009 (Year: 2009).*
Machine Translation of CN201673348U, Dec. 2010 (Year: 2010).*
Machine Translation of KR20170073878A, Jun. 2017 (Year: 2017).*
Machine Translation of CN107085323A, Aug. 2017 (Year: 2017).*
Machine Translation of CN110187570A, Aug. 2019 (Year: 2019).*

* cited by examiner

ADJUSTING DEVICE

CROSS-REFERENCE TO RELATED APPLICATION

This application claims the priority benefit of China application serial no. 202110314313.4, filed on Mar. 24, 2021. The entirety of the above-mentioned patent application is hereby incorporated by reference herein and made a part of this specification.

BACKGROUND

Technology Field

The disclosure relates to an adjusting device, and particularly, to an electromagnetic wave adjusting device capable of improving the adhesion of a sealant layer.

Description of Related Art

Display panels have been widely applied in electronic products such as mobile phones, televisions, monitors, tablet computers, car displays, wearable devices, and desktop computers. With the vigorous development of electronic products, the requirements for the quality or functions of electronic products are getting higher and higher, and such electronic products can usually be used as electronic modulation devices as well. For example, antenna devices may modulate electromagnetic waves. However, currently the antenna devices still do not fully meet the needs of consumers in all aspects.

SUMMARY

The disclosure provides an adjusting device capable of improving the adhesion of a sealant layer.

The disclosure provides an adjusting device having an active region and a peripheral region adjacent to the active region. The adjusting device includes a first substrate, a first conducting layer, a first insulating layer, a second conducting layer, a second insulating layer, and a sealant. The first insulating layer is disposed on the first conducting layer and includes a first opening disposed in the peripheral region. The second conducting layer is disposed on the first conducting layer and electrically connected to the first conducting layer through the first opening. The second insulating layer includes multiple first protruding structures disposed in the peripheral region and on the first insulating layer. The sealant layer is disposed in the peripheral region and on the second insulating layer. The first opening is disposed between two of the first protruding structures.

BRIEF DESCRIPTION OF THE DRAWINGS

The accompanying drawings are included for further understanding of the disclosure, and the accompanying drawings are incorporated into this specification and constitute a part of this specification. The drawings illustrate the embodiments of the disclosure, and together with the description are used to explain the principles of the disclosure.

DESCRIPTION OF THE EMBODIMENTS

Figure 1A:
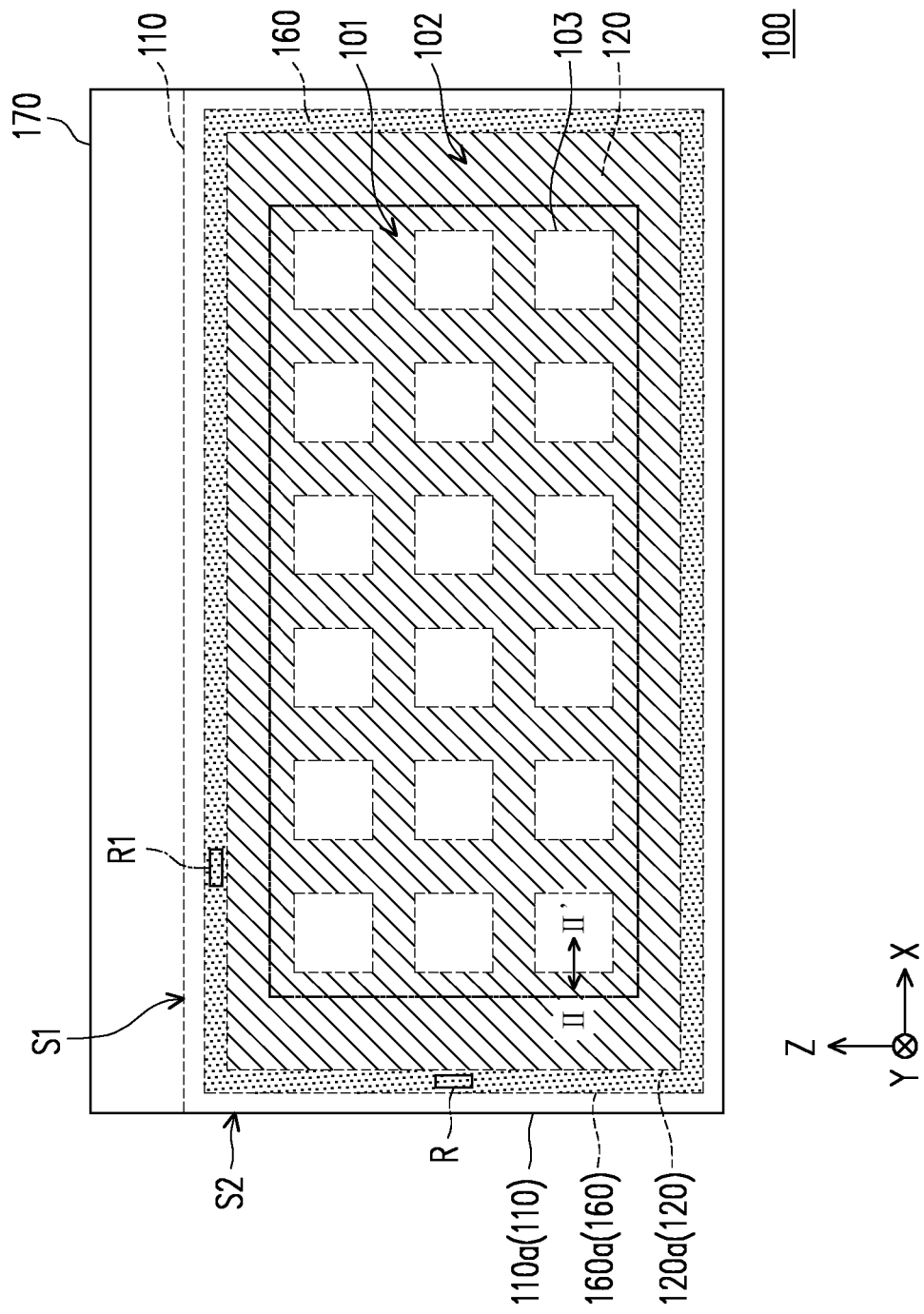
FIG. 1A is a schematic top view of an adjusting device according to an embodiment of the disclosure.

The disclosure may be understood by referring to the following detailed description with reference to the accompanying drawings. It is noted that for comprehension of the reader and simplicity of the drawings, in the drawings of the disclosure, only a part of the adjusting device is shown, and specific elements in the drawings are not necessarily drawn to scale. Moreover, the quantity and the size of each component in the drawings are only schematic and are not intended to limit the scope of the disclosure. For example, the material of the film layer, the thickness of the film layer, the outline of the film layer, the structure of the transistor, the circuit layout, etc. are only exemplary, the size or the range is also only exemplary, and the disclosure is not limited thereto.

In the following specification and claims, the terms "including", "containing", "having", etc., are open-ended terms, so they should be interpreted to mean "including but not limited to . . . ".

It should be understood that when an element or layer is referred to as being "on" or "connected to" another element or layer, it can be directly set on said other element or layer or directly connected to said other element or layer, or there is an intervening element or layer between the two (indirect connection). In contrast, when an element is referred to as being "directly on" or "directly connected to" another element or layer, there are no intervening elements or layers between the two.

Although the terms first, second, third . . . can be used to describe a variety of elements, the elements are not limited by this term. This term is only used to distinguish a single element from other elements in the specification. Different terminologies may be adopted in claims, and replaced with the first, second, third . . . in accordance with the order of elements specified in the claims. Therefore, in the following description, the first element may be described as the second element in the claims.

The terms "the scope between the first value and the second value" and "the scope ranging from the first value to the second value" mean that the range includes the first value, the second value, and other values in between.

In some embodiments of the disclosure, terms such as "connect" and "interconnect" with respect to bonding and connection, unless specifically defined, may refer to two structures that are in direct contact with each other, or may refer to two structures that are indirectly in contact with each other, wherein there are other structures set between these two structures. Moreover, the terms that describe joining and connecting may apply to the case where both structures are movable or both structures are fixed. Moreover, the term "coupling" involves any direct and indirect electrical connection means.

In this disclosure, the length and width can be measured by using an optical microscope, and the thickness can be measured by a cross-sectional image in an electron microscope, but it is not limited to this. Moreover, there may be a certain error in any two values or directions used for comparison.

The adjusting device of the disclosure may include an electromagnetic wave adjusting device, but the disclosure is not limited thereto. The adjusting device of the disclosure may include an antenna device, but the disclosure is not limited thereto. The antenna device may be a liquid crystal antenna or an antenna splicing device, for example, but the disclosure is not limited thereto. It should be noted that the adjusting device can be any combination of the foregoing, but the disclosure is not limited thereto. Moreover, the adjusting device may be rectangular, circular, polygonal, of a curved edge shape, or of other suitable shapes. The adjusting device may have peripheral systems such as a driving system, a control system, a light source system, a shelf system, and the like to support a display device, an antenna device, or a splicing device.

In the disclosure, the features of multiple embodiments to be described below may be replaced, recombined, or mixed to form other embodiments without departing from the spirit of the disclosure. The features of multiple embodiments may be used in combination as long as such combination does not depart from the spirit of the disclosure or lead to conflict.

Reference will now be made Specifically to the exemplary embodiments of the disclosure, examples of which are illustrated in the accompanying drawings. Whenever possible, the same reference numerals are used to represent the same or similar parts in the accompanying drawings and description.

Figure 1B:
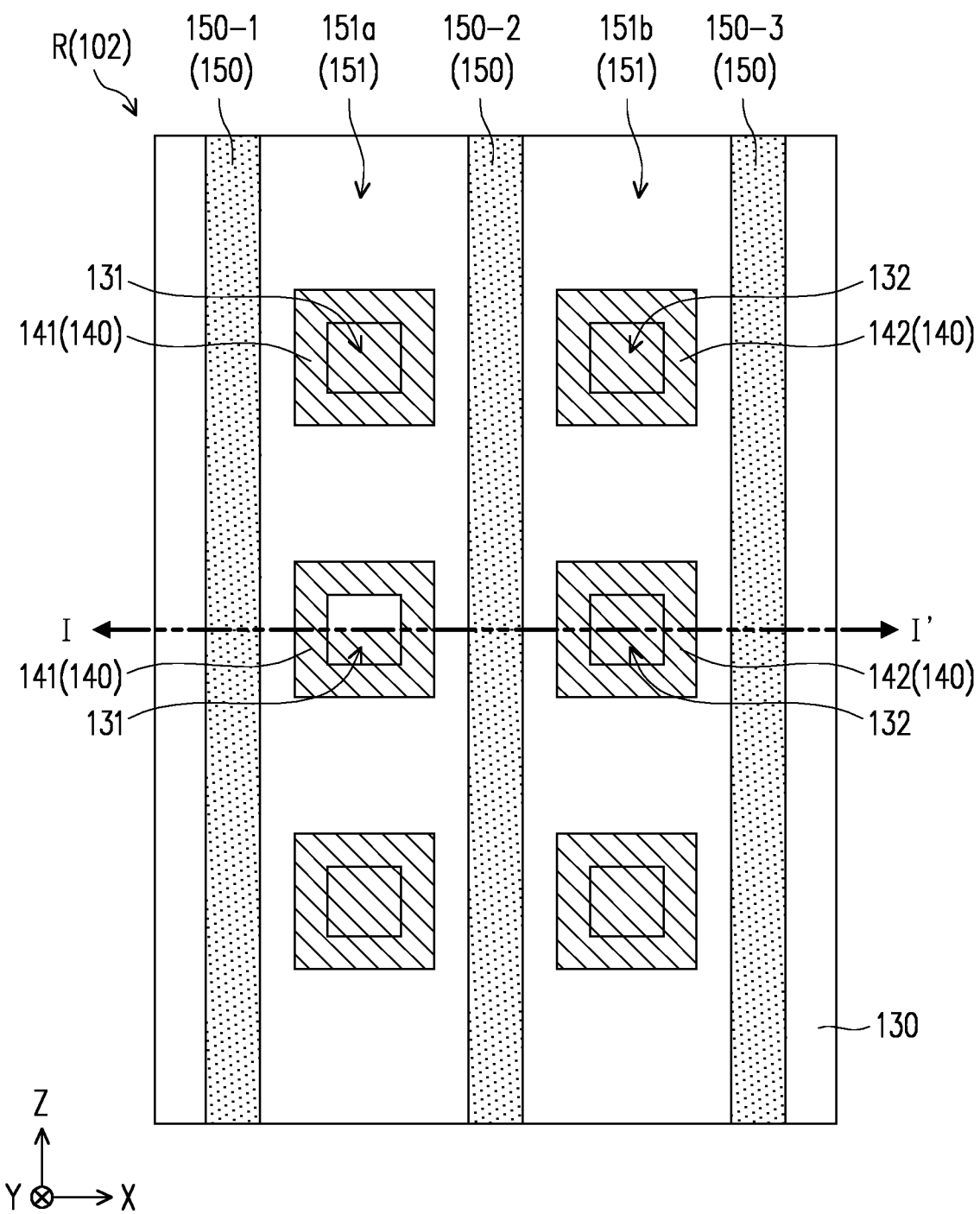
FIG. 1B is a schematic view of an enlarged region R in FIG. 1A.
Figure 1C:
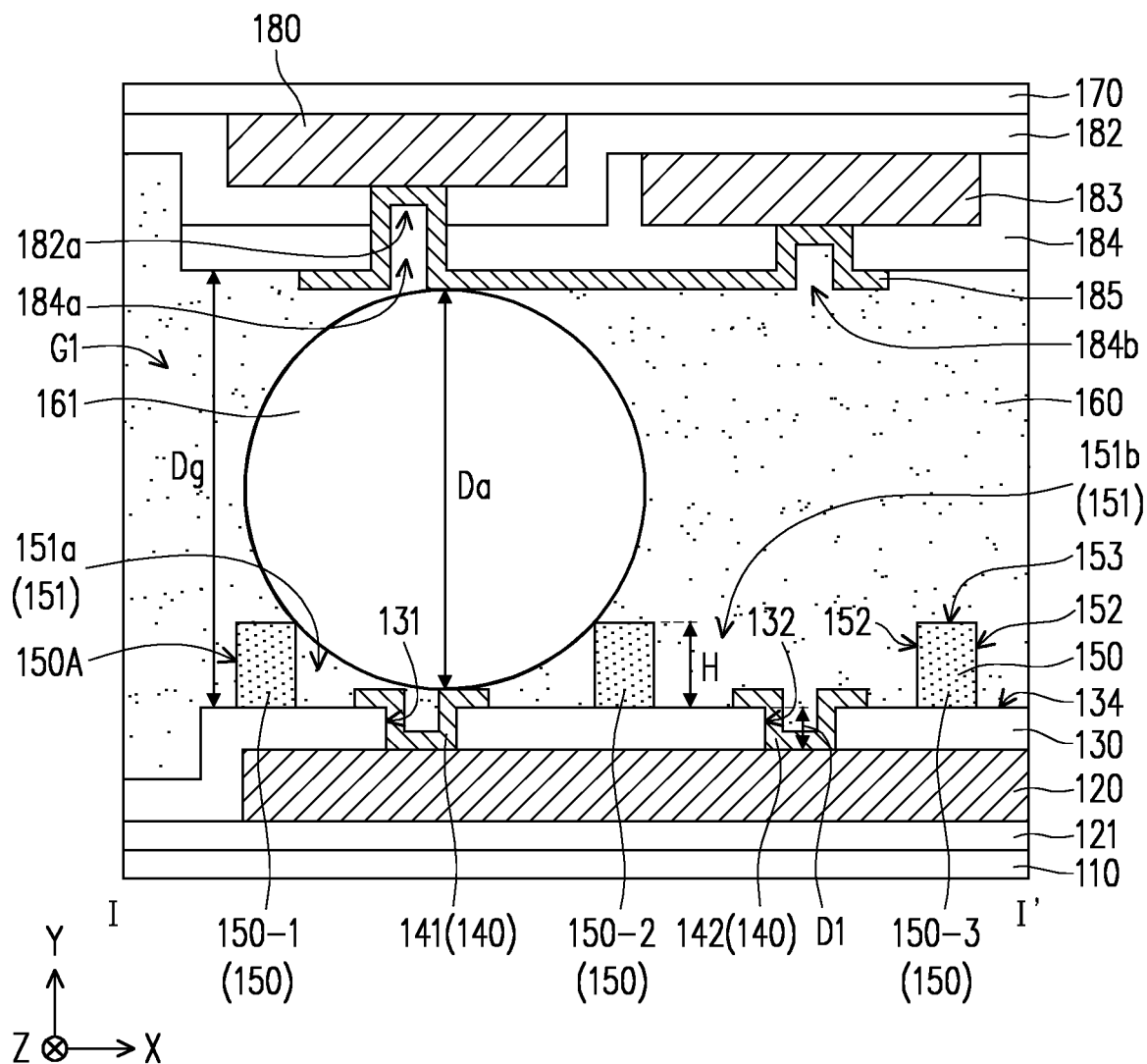
FIG. 1C is a schematic cross-sectional view of the adjusting device of FIG. 1B taken along the section line I-I'.
Figure 1D:
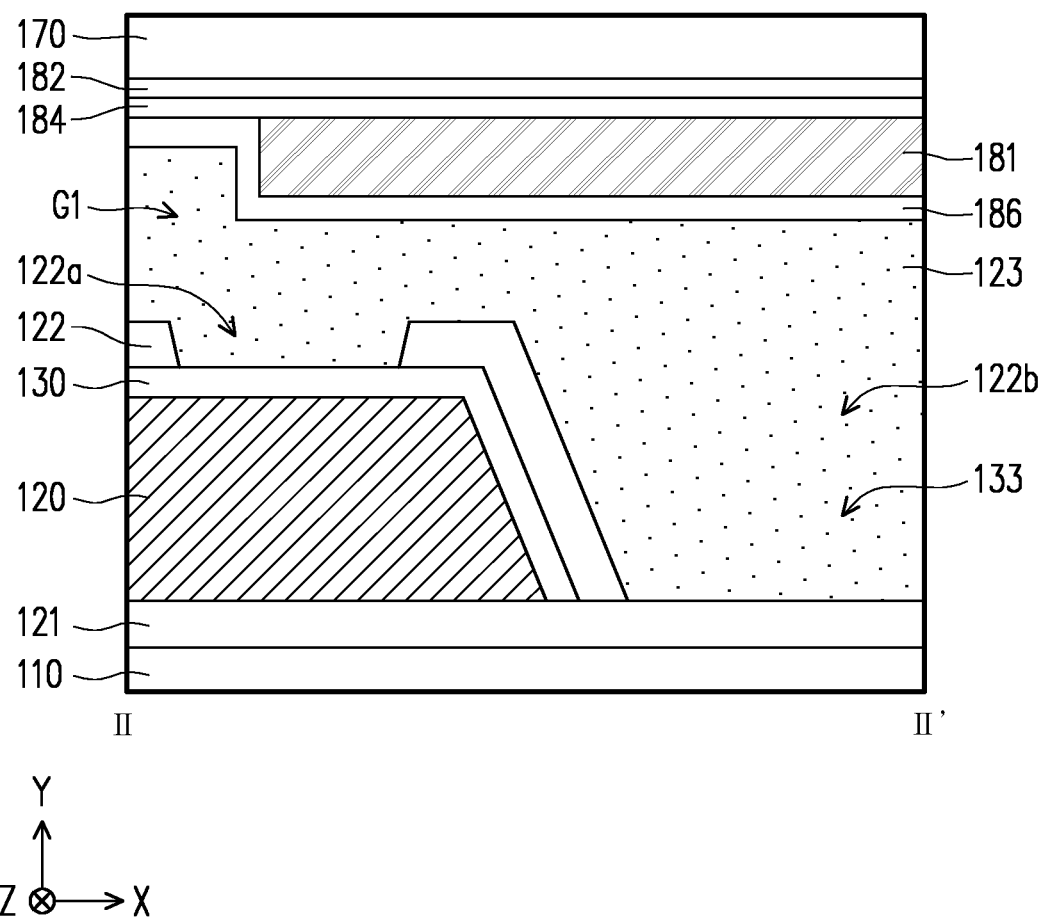
FIG. 1D is a schematic cross-sectional view of the adjusting device of FIG. 1A taken along the section line II-II'.

FIG. 1A is a schematic top view of an adjusting device according to an embodiment of the disclosure. FIG. 1B is a schematic view of an enlarged region R in FIG. 1A. FIG. 1C is a schematic cross-sectional view of the adjusting device of FIG. 1B taken along the section line I-I'. FIG. 1D is a schematic cross-sectional view of the adjusting device of FIG. 1A taken along the section line II-II'. For clarity of the drawings and convenience of description, several elements in the adjusting device are omitted in FIG. 1A and FIG. 1C. For example, a sealant layer 160 is omitted in FIG. 1B, but it is not limited thereto. According to some embodiments, the adjusting device may be an electromagnetic wave adjusting device.

Referring to FIG. 1A first, an adjusting device 100 of the embodiment has an active region 101, a peripheral region 102, and an antenna unit 103. The peripheral region 102 is adjacent to the active region 101. The peripheral region 102 may be disposed around the active region 101. The antenna unit 103 is disposed in the active region 101.

Referring to FIG. 1A to FIG. 1D altogether, the adjusting device 100 of the embodiment includes a first substrate 110, a first conducting layer 120, a first insulating layer 130, a second conducting layer 140, a second insulating layer 150A, the sealant layer 160, and a second substrate 170. The first substrate 110 and the second substrate 170 are oppositely disposed on an upper side and a lower side of the adjusting device 100. The first substrate 110 and the second substrate 170 may include a flexible substrate, a rigid substrate, or a combination thereof. For example, the material of the first substrate 110 and the second substrate 170 may include polycarbonate (PC), polyimide (PI), polyethylene terephthalate (PET), glass, other suitable substrate materials, or a combination thereof, but the disclosure is not limited thereto.

Referring to FIG. 1B and FIG. 1C, the first conducting layer 120 is disposed on the first substrate 110. The first insulating layer 130 is disposed on the first conducting layer 120 and includes multiple openings, such as a first opening 131, disposed in the peripheral region 102. The second conducting layer 140 is disposed on the first conducting layer 120, the second conducting layer 140 includes a first conductive portion 141, and the first conductive portion 141 is electrically connected to the first conducting layer 120 through the first opening 131. The second insulating layer 150A includes multiple first protruding structures 150 disposed in the peripheral region 102 and on the first insulating layer 130. In the embodiment, the first protruding structures 150 may continuously extend and may be disposed around the periphery of the active region 101, but it is not limited thereto.

Figure 3:
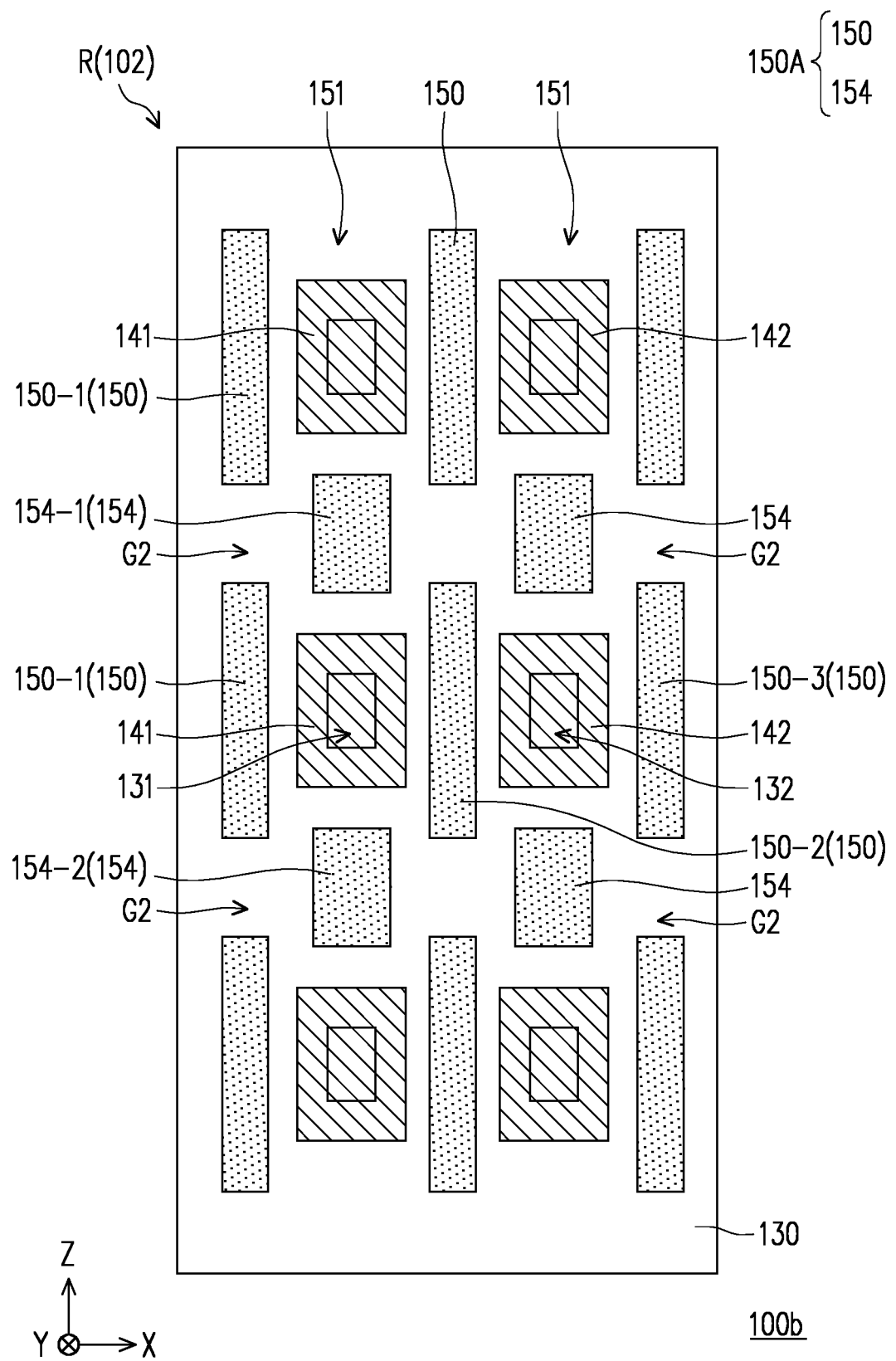
FIG. 3 is a schematic top view of an adjusting device according to another embodiment of the disclosure.

In some embodiments, the first protruding structures 150 may discontinuously extend and may be disposed around the periphery of the active region 101, as shown in FIG. 3. The sealant layer 160 is disposed in the peripheral region 102 and on the second insulating layer 150A. The first opening 131 is disposed between two first protruding structures 150 of the multiple first protruding structures 150.

Specifically, the first conducting layer 120 is disposed in the active region 101 and the peripheral region 102 on the first substrate 110, and the first conducting layer 120 is not disposed in the antenna unit 103. The first conducting layer 120 disposed in the peripheral region 102 may be overlapped with the sealant layer 160 in a third direction (Y). In the embodiment, for example, a boundary 160a of the sealant layer 160 is closer to a boundary 110a of the first substrate 110 than a boundary 120a of the first conducting layer 120, but it is not limited thereto. In some embodiments, although not shown in the drawing, the boundary 120a of the first conducting layer may be closer to the boundary 110a of the first substrate than the boundary 160a of the sealant layer, but it is not limited thereto. Moreover, the first conducting layer 120 disposed in the peripheral region 102 may transmit the signal from the second substrate 170 to the active region 101. The first conducting layer 120 in the active region 101 may be used to shield invisible light, such as electromagnetic waves, but the disclosure is not limited thereto.

In the embodiment, for example, the material of the first conducting layer 120 may be molybdenum (Mo), titanium (Ti), tantalum (Ta), niobium (Nb), hafnium (Hf), nickel (Ni), chromium (Cr), cobalt (Co), zirconium (Zr), tungsten (W), aluminum (Al), copper (Cu), silver (Ag), other suitable metals, an alloy thereof, or a combination thereof, but the disclosure is not limited thereto.

As shown in FIG. 1C, the first insulating layer 130 is disposed on the first conducting layer 120 and disposed in the active region 101 and the peripheral region 102. As shown in FIG. 1A and FIG. 1D, the first insulating layer 130 includes multiple openings 133 disposed in the active region 101 and corresponding to the antenna unit 103.

The first insulating layer 130 includes multiple openings disposed in the peripheral region 102 and may include the first opening 131 and a second opening 132, for example. For example, the first protruding structure 150 may extend along a second direction Z. Along a first direction (X), at least one first opening 131 may be disposed between two first protruding structures 150-1 and 150-2, and at least one second opening 132 may be disposed between two first protruding structures 150-2 and 150-3. Along the first direction (X), the first protruding structure 150-2 may be disposed between the first opening 131 and the second opening 132. The second opening 132 is disposed corresponding to the first opening 131 along the first direction (X). The first opening 131 and the second opening 132 each may expose part of the first conducting layer 120. The second conducting layer 140 may include the first conductive portion 141 and a second conductive portion 142. The first conductive portion 141 may be electrically connected to the first conducting layer 120 through the first opening 131, and the second conductive portion 142 may be electrically connected to the first conducting layer 120 through the second opening 132. The first conductive portion 141 and the second conductive portion 142 may be separated from each other, but the disclosure is not limited thereto. In the embodiment, the first direction (X), the second direction (Z), and the third direction (Y) are different directions. The third direction (Y) is the normal direction of the first substrate 110, for example, the first direction (X) is the extension direction of the section line I-I' and is perpendicular to the third direction (Y), for example, and the second direction (Z) is perpendicular to the first direction (X) and the third direction (Y), respectively, but the disclosure is not limited thereto.

In some embodiments, the first opening 131 and the second opening 132 may be recessed from a surface 134 of the first insulating layer 130 toward the first substrate 110. The surface 134 of the first insulating layer 130 is the surface of the first insulating layer 130 away from the first substrate 110. The first opening 131 and the second opening 132 may have a depth D1. For example, the depth D1 is the maximum depth of the first opening 131 and the maximum depth of the second opening 132 measured along the normal direction of the first substrate 110. In the embodiment, the first insulating layer 130 may have a single-layer structure or a multi-layer structure, and for example, the material of the first insulating layer 130 may be an organic insulating material, an inorganic insulating material (e.g., silicon nitride), or a combination thereof, but the disclosure is not limited thereto. The depth D1 may range from 0.05 µm and 2 µm. For example, ranging from 0.05 µm to 1 µm, or for example, ranging from 0.08 µm to 0.5 µm.

As shown in FIG. 1C, in some embodiments, the second conducting layer 140 may be disposed in the peripheral region 102 and may not be disposed in the active region 101. In some embodiments, although not shown in the drawing, the second conducting layer 140 may also be disposed in both the peripheral region 102 and the active region 101. In the embodiment, the material of the second conducting layer 140 may be a transparent conductive material or a metal material, for example. For example, the material of the second conducting layer 140 may be, for example, indium tin oxide, indium zinc oxide, indium oxide, zinc oxide, tin oxide, metal materials (e.g., aluminum, molybdenum, copper, silver, and the like), other suitable materials, or a combination thereof, but the disclosure is not limited thereto.

The second insulating layer 150A may include the first protruding structures 150, and the first protruding structures 150 are disposed on the surface 134 of the first insulating layer 130 and in the peripheral region 102. In some embodiments, the first protruding structures 150 may not be disposed in the active region 101. In some embodiments, although not shown in the drawing, the first protruding structures 150 may be disposed in both the active region 101 and the peripheral region 102. Each of the first protruding structures 150 is separated from each other, but the disclosure is not limited thereto. The first protruding structures 150 may be separated from each other by multiple spaces 151, but it is not limited thereto. The spaces 151 are disposed between two adjacent first protruding structures 150 of the first protruding structures 150, and the spaces 151 each are disposed corresponding to the first opening 131 of the first insulating layer 130. Specifically, as shown in FIG. 1B and FIG. 1C, a space 151a is disposed corresponding to the first opening 131 of the first insulating layer 130, and a space 151b is disposed corresponding to the second opening 132 of the first insulating layer 130.

As shown in FIG. 1C, in the embodiment, side surfaces 152 of the first protruding structures 150 and top surfaces 153 of the first protruding structures 150 away from the first substrate 110 may be covered by the sealant layer 160. According to some embodiments, the side surfaces 152 and top surfaces 153 of the first protruding structures 150 may be in contact with the sealant layer 160. Moreover, according to some embodiments, since the first protruding structures 150 may be three-dimensional structures protruding from the surface 134 of the first insulating layer 130 toward the second substrate 170, the contact area defined by the first protruding structures 150 and the sealant layer 160 is increased, and thereby the adhesion of the sealant layer 160 is improved. Moreover, according to some embodiments, since the first protruding structures 150 are protruding three-dimensional structures and disposed in the peripheral region 102, the first protruding structures 150 may also have the effect of blocking the penetration of moisture, and thereby the yield of the the adjusting device 100 is improved.

In the embodiment, for example, the material of the first protruding structures 150 may be an organic insulating material, an inorganic insulating material, or a combination thereof, but it is not limited thereto. For example, the inorganic insulating material may be silicon nitride, silicon oxide, or a combination thereof. In the embodiment, a height H of at least one of the first protruding structures 150 may range from 0.1 µm to 3 µm, for example, but it is not limited thereto. According to some embodiments, the heights H of all first protruding structures 150 may range from 0.1 µm to 3 µm, for example. When the heights of the first protruding structures are less than 0.1 µm, the contact area defined by the first protruding structures and the sealant layer is insufficient, and thus the adhesion of the sealant layer may not be effectively improved. The height H is, for example, the maximum heights of the first protruding structures 150 measured along the normal direction of the first substrate 110. Moreover, in the embodiment, a distance Dg of a gap G1 between the first substrate 110 and the second substrate 170 may range from 2 µm to 10 µm, for example, but the disclosure is not limited thereto. In some embodiments, the distance Dg of the gap G1 may also be 3 µm. Therefore, when the distance Dg of the gap G1 between the first substrate 110 and the second substrate 170 is about 3 µm and the heights of the first protruding structures are greater than 3 µm, the first protruding structures may resist the second substrate, which causes poor fluidity of the sealant layer during processing. For example, the distance Dg is the distance between the first substrate 110 and the second substrate 170 measured along the normal direction of the first substrate 110.

The sealant layer 160 may be disposed in the peripheral region 102 and on the second insulating layer 150A. The sealant layer 160 may be disposed in the gap G1 between the first substrate 110 and the second substrate 170 so that the first substrate 110 may be adhered to and assembled with the second substrate 170 through the sealant layer 160. In the embodiment, the sealant layer 160 may be disposed around the first protruding structures 150. Moreover, the sealant layer 160 may include a conductive particle 161. As shown in FIG. 1C, the conductive particle 161 may be in contact with the second conducting layer 140 on the first substrate 110 and a conducting layer 185 on the second substrate 170. Accordingly, the second conducting layer 140 may transmit signals from the second substrate 170 to the first conducting layer 120 and the active region 101. In the embodiment, a diameter Da of the conductive particle 161 may range from 2 μm to 10 μm, for example, but it is not limited thereto. In some embodiments, the diameter Da of the conductive particle 161 may also be 3 μm. The diameter Da is the maximum diameter of the conductive particle 161 measured along the normal direction of the first substrate 110, for example.

As shown in FIG. 1C and FIG. 1D, in the embodiment, the adjusting device 100 may further include an insulating layer 121, an insulating layer 122, liquid crystals 123, a conducting layer 180, a conducting layer 181, an insulating layer 182, a conducting layer 183, an insulating layer 184, and the conducting layer 185. Specifically, the insulating layer 121 is disposed between the first conducting layer 120 and the first substrate 110 and disposed in the active region 101 and the peripheral region 102. The insulating layer 122 is disposed on the first insulating layer 130 and in the opening 133 of the first insulating layer 130, and the insulating layer 122 is disposed in the active region 101. The insulating layer 122 has an opening 122a and an opening 122b. The opening 122a exposes part of the first insulating layer 130, and the opening 122b exposes part of the insulating layer 121. The opening 122b may be disposed corresponding to the antenna unit 103. The liquid crystals 123 are disposed in the active region 101 and disposed in the gap G1, the opening 122a, and the opening 122b between the first substrate 110 and the second substrate 170.

Next, the conducting layer 180 is disposed on the second substrate 170 and disposed in the active region 101 and the peripheral region 102. The insulating layer 182 is disposed on the second substrate 170 and in the active region 101 and the peripheral region 102 to cover the conducting layer 180. The insulating layer 182 has an opening 182a to expose part of the conducting layer 180. The conducting layer 183 is disposed on the insulating layer 182 and disposed in the active region 101 and the peripheral region 102. The insulating layer 184 is disposed in the active region 101 and the peripheral region 102. The insulating layer 184 in the peripheral region 102 is disposed on the insulating layer 182 to cover the conducting layer 183. The insulating layer 184 in the peripheral region 102 has an opening 184a and an opening 184b, the opening 184a communicates with the opening 182a to expose part of the conducting layer 180, and the opening 184b exposes part of the conducting layer 183. The conducting layer 181 is disposed on the insulating layer 184 and disposed in the active region 101. The insulating layer 186 in the active region 101 is disposed on the second substrate 170 to cover the conducting layer 181. The conducting layer 185 is disposed on the insulating layer 184, in the opening 184a, in the opening 182a, and in the opening 184b. The conducting layer 185 may be disposed in the peripheral region 102 and the active region 101. According to some embodiments, the conducting layer 185 may be disposed in the peripheral region 102 and may not be disposed in the active region 101. The conducting layer 185 may be electrically connected to the conducting layer 180 through the opening 184a, and the conducting layer 185 may also be electrically connected to the conducting layer 183 through the opening 184b. The conducting layer 185 may also be in contact with the conductive particle 161 in the sealant layer 160, so signals from the conducting layer 180 in the second substrate 170 may be transmitted to the first conducting layer 120 in the first substrate 110 through the conducting layer 185, the conductive particle 161, and the second conducting layer 140. Moreover, signals from the conducting layer 183 in the second substrate 170 may also be transmitted to the first conducting layer 120 in the first substrate 110 through the conducting layer 185, the conductive particle 161, and the second conducting layer 140.

Although the first protruding structure 150 in the embodiment is disposed in the peripheral region 102 and disposed on the first substrate 110, the disclosure does not limit where the first protruding structure is disposed. That is, in some embodiments, the first protruding structure may also be disposed on the second substrate. In some embodiments, the first protruding structure may also be disposed on both the first substrate and the second substrate.

As shown in FIG. 1A and FIG. 1B, the first substrate 110 includes a side S1 and a side S2, and the side S1 is connected to the side S2. The side S1 extends along the first direction (X), and the side S2 extends along the second direction (Z). Taking the region R as an example for illustration, the region R is adjacent to the side S2 of the first substrate 110, and the extension direction of the first protruding structure 150 in the region R may be the second direction (Z), that is, it may be the same as the extension direction of the side S2. A region R1 is adjacent to the side S1 of the first substrate 110, and the extension direction of the first protruding structure 150 in the region R1 may be the first direction (X), that is, it may be the same as the extension direction of the side S1.

The embodiment is illustrated with the region R in FIG. 1A as an example, so the first protruding structure 150 extends along the second direction (Z). Along the first direction (X), at least one first opening 131 may be disposed between the two first protruding structures 150-1 and 150-2. Although not shown in the drawing, in the region R1, the first protruding structure 150 may extend along the first direction (X). Along the second direction (Z), at least one first opening 131 may be disposed between two first protruding structures 150.

Other embodiments are provided below for explanation. It should be noted here that the following embodiments adopt the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content will not be iterated in the following embodiments.

Figure 2:
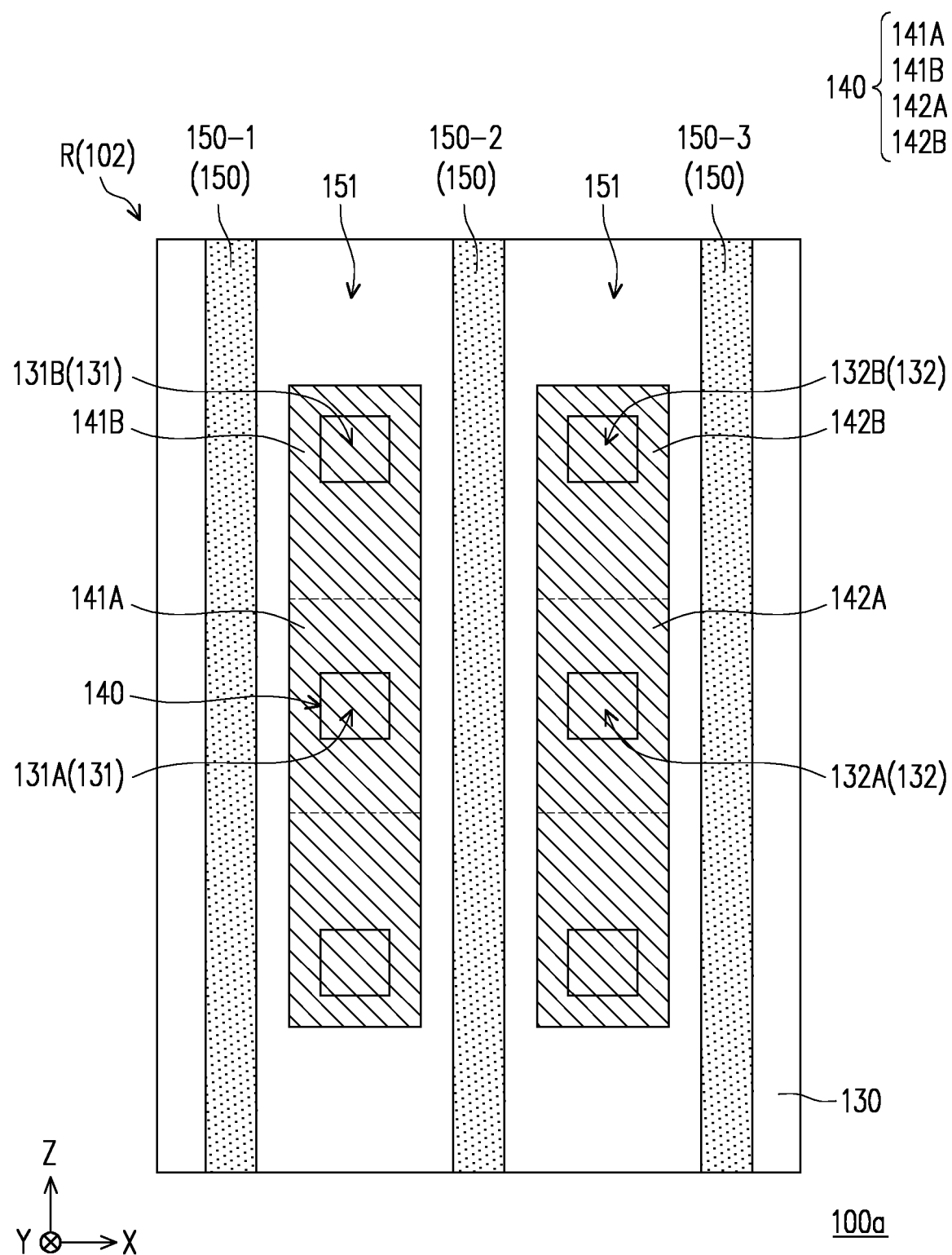
FIG. 2 is a schematic top view of an adjusting device according to another embodiment of the disclosure.

FIG. 2 is a schematic top view of an adjusting device according to another embodiment of the disclosure. Referring to both FIG. 1B and FIG. 2, an adjusting device 100a of the embodiment is substantially similar to the adjusting device 100 of FIG. 1B. Therefore, the same and similar elements in the two embodiments are not repeated herein. The main difference between the adjusting device 100a of the embodiment and the adjusting device 100 is the design of the second conducting layer 140 and the first opening 131.

In the adjusting device 100a of the embodiment, the first insulating layer 130 includes a first opening 131A and another first opening 131B disposed in the peripheral region 102, and the another first opening 131B is disposed corresponding to the first opening 131A along the second direction (Z). The first protruding structure 150 may extend along the second direction (Z). The first opening 131A is disposed between the two first protruding structures 150-1 and 150-2 along the first direction (X). The second conducting layer 140 includes a first conductive portion 141A and another first conductive portion 141B. The first conductive portion 141A is electrically connected to the first conducting layer 120 through the first opening 131A, and the another first conductive portion 141B is electrically connected to the first conducting layer 120 through the another first opening 131B. The first conductive portion 141A and the another first conductive portion 141B are connected to each other. Specifically, the first conductive portion 141A and the another first conductive portion 141B are connected to each other along the second direction (Z). Moreover, the first insulating layer 130 may further include a second opening 132A and another second opening 132B disposed in the peripheral region 102, and the another second opening 132B is disposed corresponding to the second opening 132A along the second direction (Z). The second conducting layer 140 may further include a second conductive portion 142A and another second conductive portion 142B. The second conductive portion 142A is electrically connected to the first conducting layer 120 through the second opening 132A, and the another second conductive portion 142B is electrically connected to the first conducting layer 120 through the another second opening 132B. The second conductive portion 142A and the another second conductive portion 142B are connected to each other. Specifically, the second conductive portion 142A and the another second conductive portion 142B are connected to each other along the second direction (Z).

FIG. 3 is a schematic top view of an electromagnetic wave adjusting device according to another embodiment of the disclosure. Referring to both FIG. 1B and FIG. 3, an electromagnetic wave adjusting device 100b of the embodiment is substantially similar to the electromagnetic wave adjusting device 100 of FIG. 1B. Therefore, the same and similar elements in the two embodiments are not repeated herein. The main difference between the electromagnetic wave adjusting device 100b of the embodiment and the electromagnetic wave adjusting device 100 is that in the electromagnetic wave adjusting device 100b of the embodiment, the second insulating layer 150A further includes multiple second protruding structures 154 disposed in the peripheral region 102 and separated from multiple first protruding structures 150. The first opening 131 is disposed between two first protruding structures 150 along the first direction (X) and is disposed between two of the second protruding structures 154 along the second direction (Z). Specifically, the first opening 131 is disposed between the first protruding structures 150-1 and 150-2 along the first direction (X) and is disposed between two second protruding structures 154-1 and 154-2 along the second direction (Z).

In the embodiment, the first protruding structure 150-1 (or the first protruding structure 150-2, or the first protruding structure 150-3) is disposed and extends in a discontinuous manner, so there is a gap G2 between two adjacent first protruding structures 150-1 (or the first protruding structures 150-2, or the first protruding structures 150-3). Accordingly, the sealant layer 160 may flow more easily during processing with the disposition of the gap G2. Specifically, the gap G2 is disposed on the first protruding structure 150 extending along the second direction (Z). Taking the first protruding structure 150-1 as an illustration, there is the gap G2 between two adjacent first protruding structures 150-1 extending along the second direction (Z).

In the embodiment, the material of the second protruding structures 154 is the same or similar to the material of multiple first protruding structures 150b, which therefore is not repeated herein. Moreover, since the second protruding structures 154 may also be three-dimensional structures protruding from the surface of the first insulating layer 130 toward the second substrate (not shown), the contact area defined by the second protruding structures 154 and the sealant layer (not shown) may be increased, and thereby the adhesion of the sealant layer may be further improved.

Figure 4A:
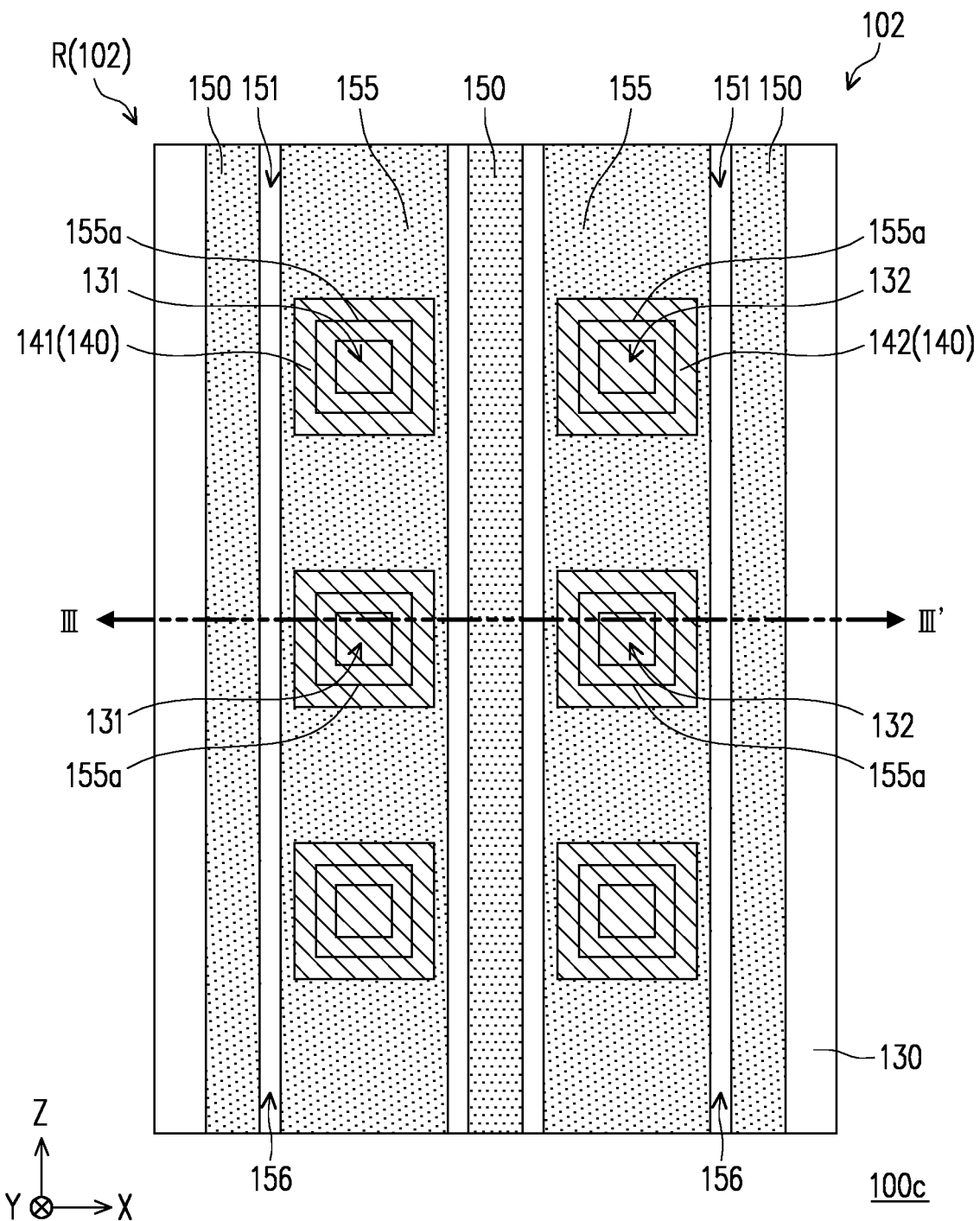
FIG. 4A is a schematic top view of an adjusting device according to another embodiment of the disclosure.
Figure 4B:
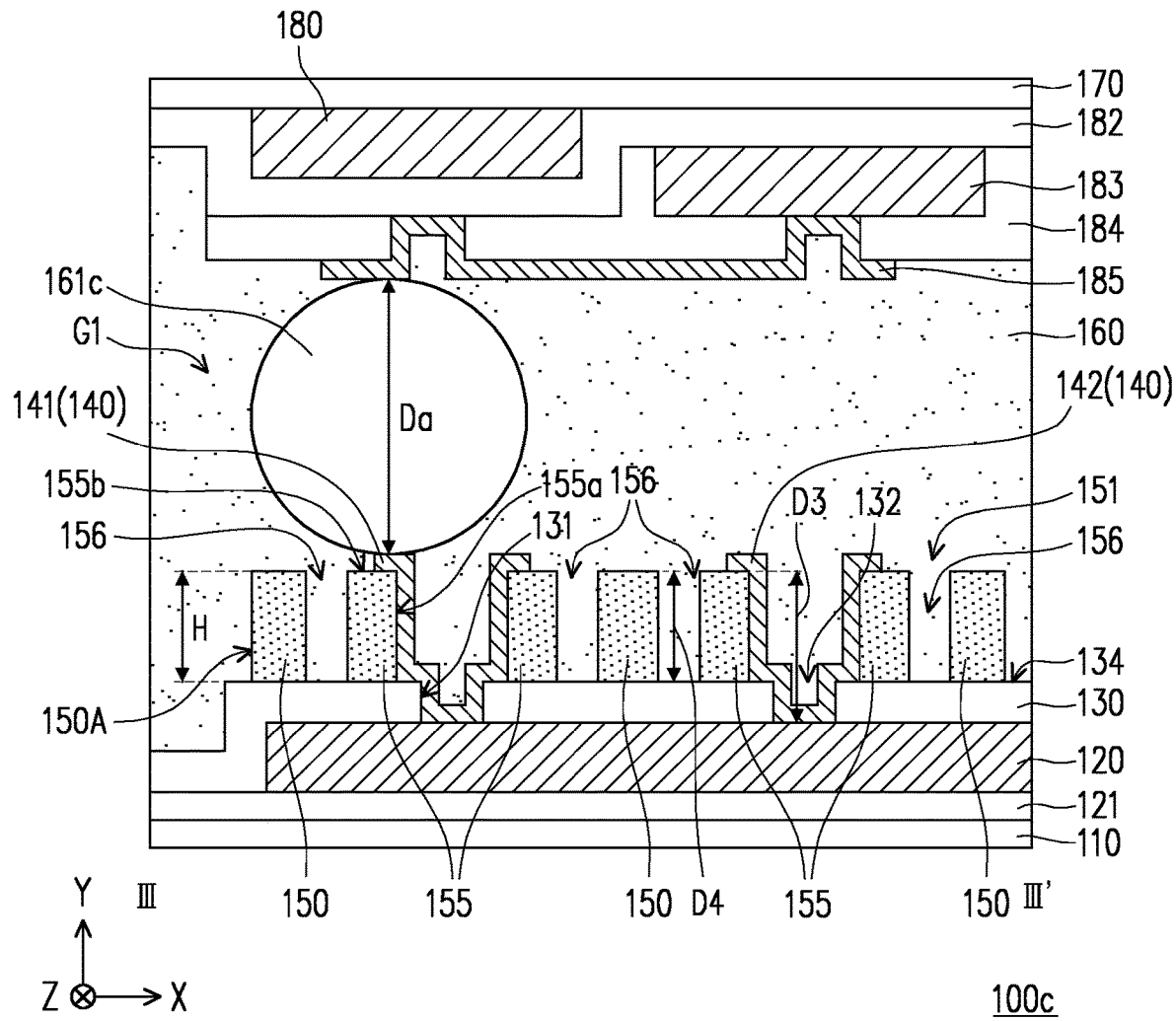
FIG. 4B is a schematic cross-sectional view of the adjusting device of FIG. 4A taken along the section line III-III'.

FIG. 4A is a schematic top view of an adjusting device according to another embodiment of the disclosure. FIG. 4B is a schematic cross-sectional view of the adjusting device of FIG. 4A taken along the section line III-III'. Referring to FIG. 1B-FIG. 1C and FIG. 4A-FIG. 4B altogether, an adjusting device 100c of the embodiment is substantially similar to the adjusting device 100 of FIG. 1B-FIG. 1C. Therefore, the same and similar elements in the two embodiments are not repeated herein. The main difference between the adjusting device 100c of the embodiment and the adjusting device 100 is that the adjusting device 100c of the embodiment further includes multiple third protruding structures 155 and multiple third openings 155a. In the first direction (X), the third protruding structure 155 may be disposed between two first protruding structures 150.

As shown in FIG. 4A and FIG. 4B, the second insulating layer 150A further includes the third protruding structures 155 disposed in the peripheral region 102. The third protruding structures 155 may continuously extend and be disposed around the periphery of the active region 101, but it is not limited thereto. Part of the first conductive portion 141 may be disposed on at least one of the third protrusion structures 155. The at least one of the third protruding structures 155 includes the third opening 155a. As shown in FIG. 4B, the third opening 155a may be connected to the first opening 131 of the first insulating layer 130. Another part of the first conductive portion 141 may be disposed on a side wall of the third opening 155a. Although not shown in the drawing, the third protruding structures 155 may also be disposed and extend in a discontinuous manner. For example, a gap (e.g., the gap G2 as shown in FIG. 3) may be disposed on the third protrusion structure 155 extending in the second direction (Z). Accordingly, the sealant layer 160 may flow more easily during processing with the disposition of the gap.

Multiple fourth openings 156 may be disposed between the adjacent first protruding structures 150 and the third protruding structures 155. The fourth openings 156 expose part of the first insulating layer 130 and have a depth D4. For example, the depth D4 is the maximum depth of the fourth opening 156 measured along the normal direction of the first substrate 110. In some embodiments, the value of the depth D4 of the fourth opening 156 is equal to the value of the height H of the first protruding structures 150, for example, but it is not limited thereto.

In the embodiment, the third protruding structures 155 include the third openings 155a. In the embodiment, the first conductive portions 141 (or the second conductive portions 142) of the second conducting layer 140 may be disposed on top surfaces 155b of the third protruding structures 155 away from the first substrate 110, in the third openings 155a, and in the first openings 131. As shown in FIG. 4B, the third opening 155a of the third protruding structure 155 may be connected to the first opening 131 of the first insulating layer 130. Accordingly, the first conductive portion 141 may be electrically connected to the first conducting layer 120 through the third opening 155a and the first opening 131. In the embodiment, since the second conducting layer 140 may be disposed on the top surfaces 155b of the third protruding structures 155, the distance between the conducting layer 185 on the second substrate 170 and the second conducting layer 140 on the first substrate 110 may be reduced, and thereby the conductive particle 161c having a smaller diameter Da can be used. Accordingly, the cost of the conductive particle 161c may be reduced, or the design of the size of the gap G1 may be more flexible.

In the embodiment, since the third protruding structures 155 may also be three-dimensional structures protruding from the surface 134 of the first insulating layer 130 toward the second substrate 170, the contact area defined by the third protruding structures 155 and and the sealant layer 160 may be increased, and thereby the adhesion of the sealant layer 160 may be further improved.

According to some embodiments, the second insulating layer 150A may include multiple protruding structures. For example, the second insulating layer 150A may include multiple first protrusion structures 150. For example, the second insulating layer 150A may include multiple first protrusion structures 150 and multiple second protrusion structures 154. For example, the second insulating layer 150A may include multiple first protrusion structures 150 and multiple third protrusion structures 155. For example, the second insulating layer 150A may include multiple first protrusion structures 150, multiple second protrusion structures 154, and multiple third protrusion structures 155. Referring to FIG. 3, the extension direction of the first protruding structure 150 is the second direction (Z), and at least one first opening 131 is disposed between the two first protruding structures 150-1 and 150-2 along the first direction (X). The first opening 131 is disposed between the two second protruding structures 154-1 and 154-2 along the second direction (Z). There is no second conducting layer 140 disposed on the first protruding structure 150 and the second protruding structure 154. According to some embodiments, the protruding structure on which the second conducting layer 140 is disposed may be defined as the third protruding structure 155. For example, referring to FIG. 4B, part of the second conducting layer 140 is disposed on the third protruding structure 155. Specifically, the first conductive portion 141 of the second conducting layer 140 is disposed on the third protrusion structure 155. Moreover, the third protruding structure 155 may have the third opening 155a, and the third opening 155a may be connected to the first opening 131 of the first insulating layer 130.

Figure 5A:
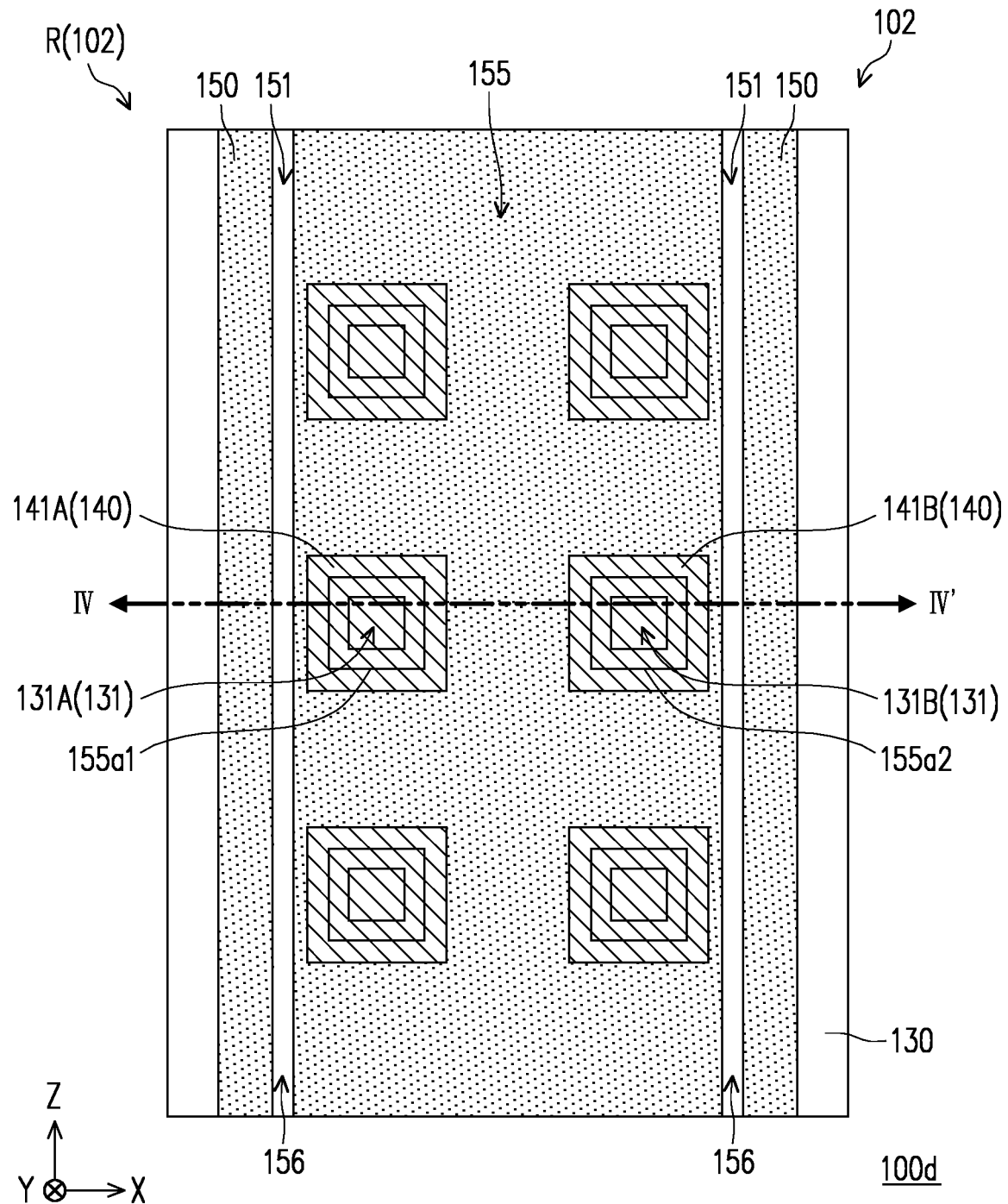
FIG. 5A is a schematic top view of an adjusting device according to another embodiment of the disclosure.
Figure 5B:
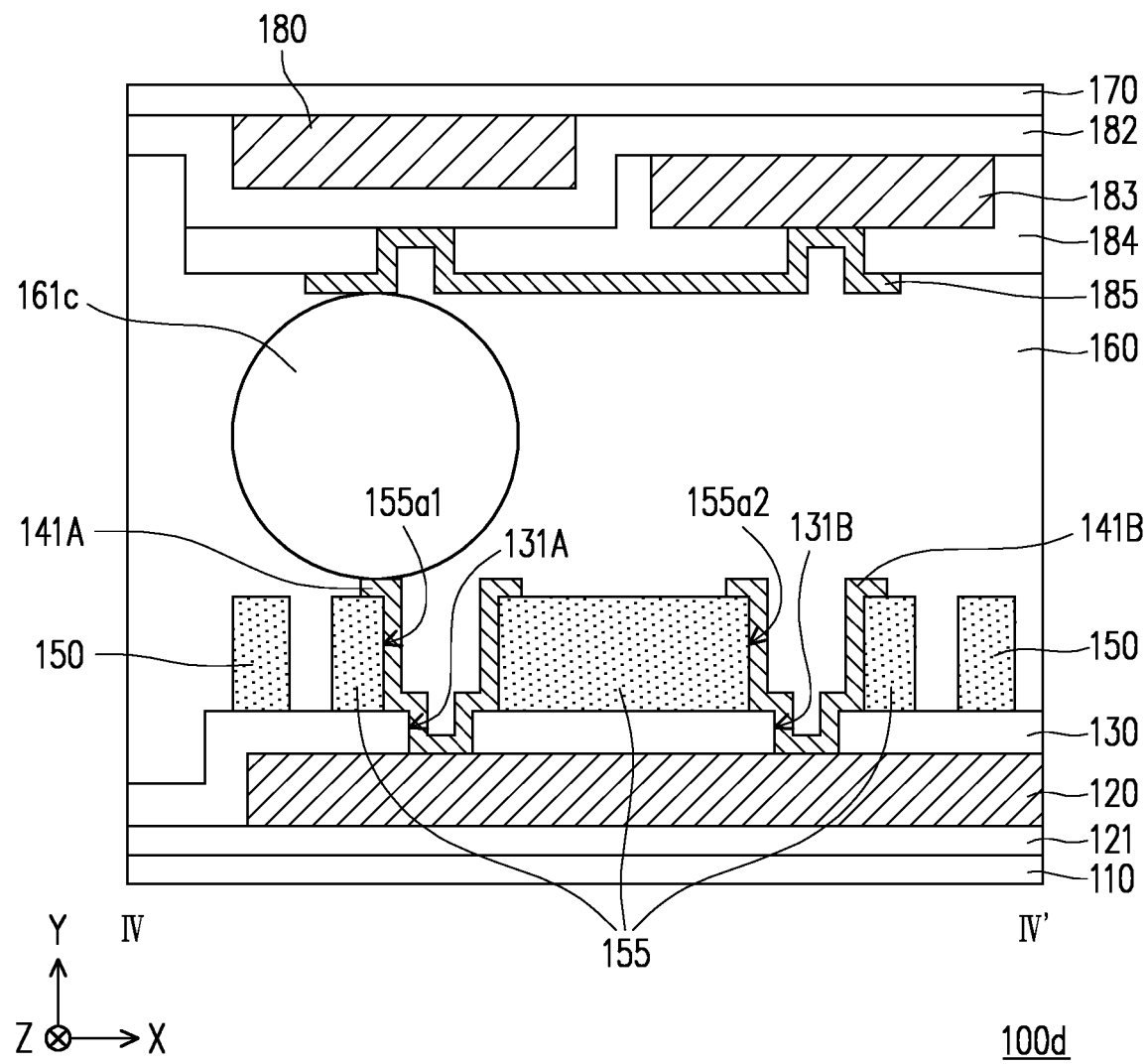
FIG. 5B is a schematic cross-sectional view of the adjusting device of FIG. 5A taken along the section line IV-IV'.

FIG. 5A is a schematic top view of an adjusting device according to another embodiment of the disclosure. FIG. 5B is a schematic cross-sectional view of the adjusting device of FIG. 5A taken along the section line IV-IV'. Referring to both FIG. 4A-FIG. 4B and FIG. 5A-FIG. 5B, an adjusting device 100d of the embodiment is substantially similar to the adjusting device 100c of FIG. 4A-FIG. 4B. Therefore, the same and similar elements in the two embodiments are not repeated herein. The main difference between the adjusting device 100d of the embodiment and the adjusting device 100c is the design of the third opening 155a in the third protruding structure 155.

In the embodiment, along the first direction (X), the third protruding structure 155 is disposed between the two first protruding structures 150. The third protruding structure 155 includes at least two third openings 155a1 and 155a2 along the first direction (X). The first insulating layer 130 includes the first opening 131A and the another first opening 131B disposed in the peripheral region 102, and the another first opening 131B is disposed corresponding to the first opening 131A along the first direction (X). The second conducting layer 140 includes the first conductive portion 141A and the another first conductive portion 141B. The first conductive portion 141A and the another first conductive portion 141B each are connected to the first conducting layer 120 through the two third openings 155a1 and 155a2. Along the first direction (X), the first conductive portion 141 and the conductive portion 142 are not connected.

Figure 6A:
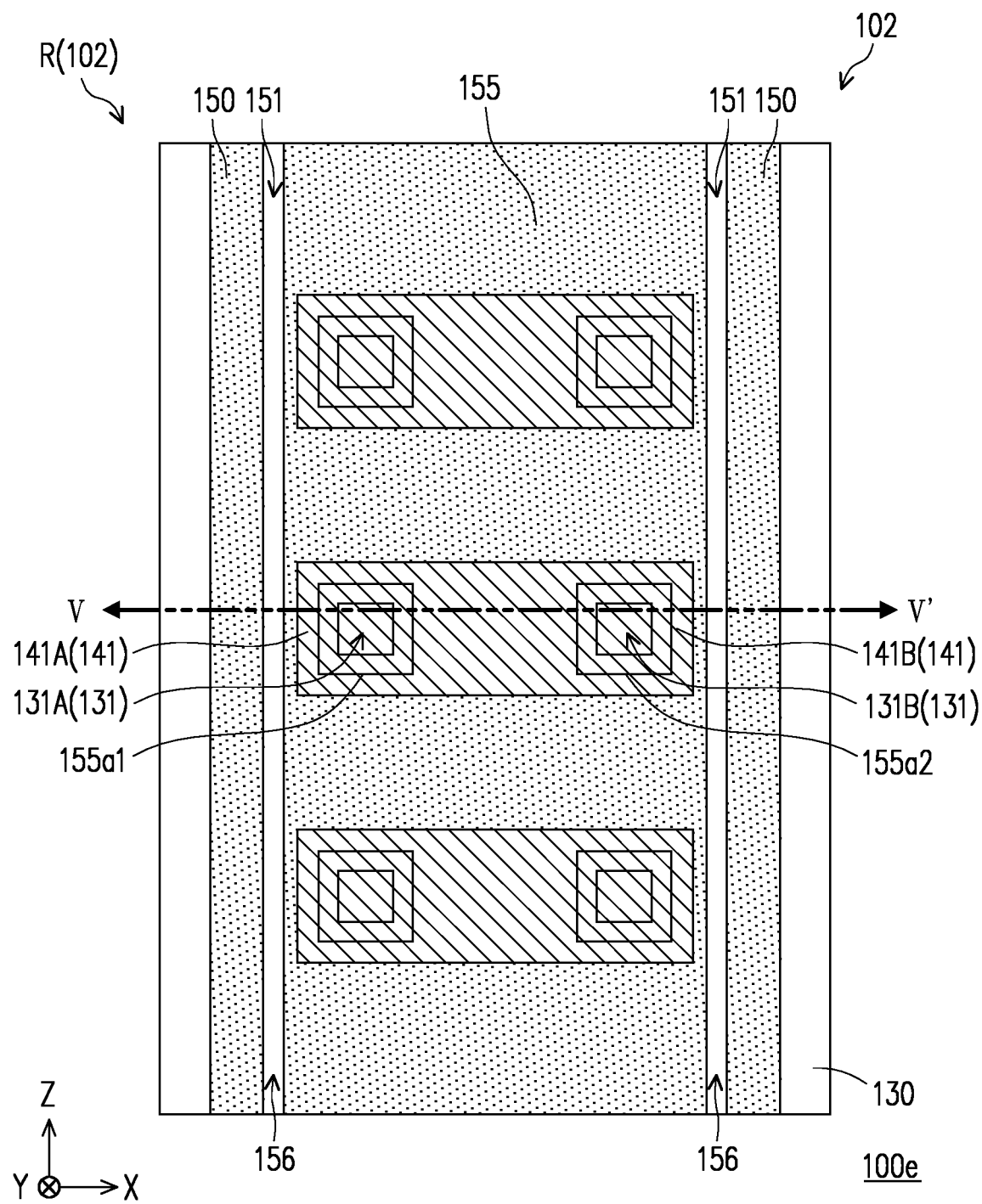
FIG. 6A is a schematic top view of an adjusting device according to another embodiment of the disclosure.
Figure 6B:
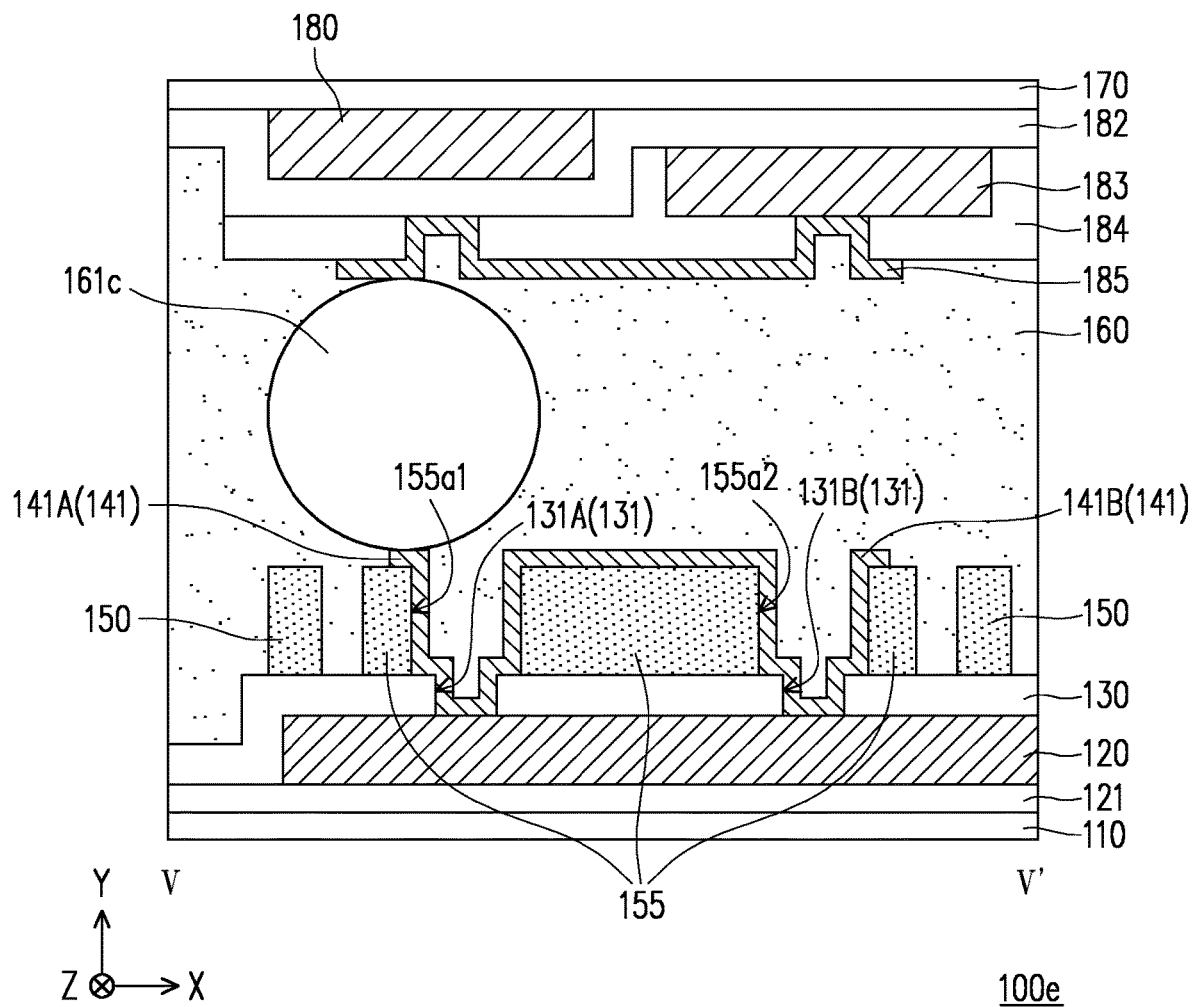
FIG. 6B is a schematic cross-sectional view of the adjusting device of FIG. 6A taken along the section line V-V'.

FIG. 6A is a schematic top view of an adjusting device according to another embodiment of the disclosure. FIG. 6B is a schematic cross-sectional view of the adjusting device of FIG. 6A taken along the section line V-V'. Referring to FIG. 5A-FIG. 5B and FIG. 6A-FIG. 6B altogether, an adjusting device 100e of the embodiment is substantially similar to the adjusting device 100d of FIG. 5A-FIG. 5B. Therefore, the same and similar elements in the two embodiments are not repeated herein. The main difference between the adjusting device 100e of the embodiment and the adjusting device 100d is the design of the third opening 155a in the third protruding structure 155.

In the embodiment, along the first direction (X), the third protruding structure 155 includes the third openings 155a1 and 155a2. The first insulating layer 130 includes the first opening 131A and the another first opening 131B disposed in the peripheral region 102, and the second conducting layer 140 includes the first conductive portion 141A and the another first conductive portion 141B. Along the first direction (X), the first conductive portion 141A and the another first conductive portion 141B are connected to each other. Moreover, the connected first conductive portion 141A and the another first conductive portion 141B are filled in the third openings 155a1 and 155a2 of the third protruding structure 155. Accordingly, the connected first conductive portion 141A and the another first conductive portion 141B are electrically connected to the first conducting layer 120 through the third openings 155a1 and 155a2, the first opening 131A, and the another first opening 131B.

In summary, in the adjusting device of the embodiments of the disclosure, with the disposition of multiple first protruding structures in the peripheral region, the contact area between the first protruding structures and the sealant layer may be increased, and the adhesion of the sealant layer may be increased. Moreover, since the first protruding structures are protruding three-dimensional structures and are disposed in the peripheral region, the first protruding structures may also have the effect of blocking the penetration of moisture, and thereby the yield of the adjusting device may be improved.

Finally, it should be noted that the above embodiments are merely intended for describing the technical solutions of the disclosure rather than limiting the disclosure. Although the disclosure is described Specifically with reference to the foregoing embodiments, those of ordinary skill in the art should understand that they can still make modifications to the technical solutions described in the foregoing embodiments or make equivalent substitutions to some or all technical features thereof, without departing from scope of the technical solutions of the embodiments of the disclosure.

What is claimed is:

1. An adjusting device, comprising an active region and a peripheral region, wherein the peripheral region is adjacent to the active region, and the adjusting device comprises:

a first substrate;
a first conducting layer disposed on the first substrate;
a first insulating layer disposed on the first conducting layer and comprising a first opening disposed in the peripheral region;
a second conducting layer disposed on the first conducting layer, wherein the second conducting layer comprises a first conductive portion, and the first conductive portion is electrically connected to the first conducting layer through the first opening;
a second insulating layer disposed on the first insulating layer and comprising a plurality of first protruding structures disposed in the peripheral region and being defined by only material of the second insulating layer protruding from a surface of the first insulating layer;
a sealant layer disposed in the peripheral region and on the second insulating layer and on the first insulating layer, a maximum thickness of the sealant layer measured from the surface of the first insulating layer being greater than a height of plurality of first protruding structures measured from the surface of first insulating layer,
wherein the plurality of the first protruding structures comprises a first protruding pattern and a second protruding pattern, at least a portion of the first protruding pattern extends along a first direction, and at least a portion of the second protruding pattern extends along a first direction,
wherein the first conductive portion is disposed between the first protruding pattern and the second protruding pattern along a second direction, and the second direction is a radial direction extending outwardly from the active region and perpendicularly to the first direction,
wherein, in a cross-sectional view, a side surface and a top surface of the first protruding pattern are directly in contact with the sealant layer and a side surface and a top surface of the second protruding pattern are directly in contact with the sealant layer, and
wherein the first opening is disposed between the first protruding pattern and the second protruding pattern along the second direction, and the first conductive portion is spaced apart from the first protruding pattern and spaced apart from the second protruding pattern.

2. The adjusting device according to claim 1, wherein the height of at least one of the first protruding structures ranges from 0.1 μm to 3 μm.

3. The adjusting device according to claim 1, wherein the first protruding structures continuously extend and are disposed around a periphery of the active region.

4. The adjusting device according to claim 1, wherein the first protruding structures discontinuously extend and are disposed around a periphery of the active region.

5. The adjusting device according to claim 1, wherein, in a cross-sectional view, the top surface of the first protruding pattern and top surface of the second protruding pattern are closer to a second substrate than a topmost surface of the first conductive portion.

6. The adjusting device according to claim 1, wherein the second insulating layer further comprises a plurality of second protruding structures disposed in the peripheral region, and part of the first conductive portion is disposed on at least one of the second protruding structures.

7. The adjusting device according to claim 6, wherein the at least one of the second protruding structures is disposed between two of the first protruding structures along the second direction and extends along the first direction.

8. The adjusting device according to claim 6, wherein the at least one of the second protruding structures comprises a second opening, and the second opening is connected to the first opening of the first insulating layer.

9. The adjusting device according to claim 8, wherein another part of the first conductive portion is disposed on a side wall of the second opening.

10. The adjusting device according to claim 1, wherein the second insulating layer further comprises a plurality of second protruding structures disposed in the peripheral region and separated from the first protruding structures,
wherein the first opening is disposed between two of the second protruding structures along the first direction.

11. The adjusting device according to claim 1, wherein the first insulating layer further comprises a second opening disposed in the peripheral region, the second conducting layer further comprises a second conductive portion, the second conductive portion is electrically connected to the first conducting layer through the second opening, and the first conductive portion and the second conductive portion are separated from each other.

12. The adjusting device according to claim 11, wherein the second opening is disposed corresponding to the first opening along the second direction.

13. The adjusting device according to claim 1, wherein the first insulating layer further comprises another first opening disposed in the peripheral region, the second conducting layer comprises another first conductive portion, the another first conductive portion is electrically connected to the first conducting layer through the another first opening, and the first conductive portion and the another first conductive portion are connected to each other.

14. The adjusting device according to claim 13, wherein the first conductive portion and the another first conductive portion are connected to each other along the first direction, and the first opening and the another first opening are disposed along the first direction.

15. The adjusting device according to claim 13, wherein the first conductive portion and the another first conductive portion are connected to each other along the second direction, and the first opening and the another first opening are disposed along the second direction.

16. The adjusting device according to claim 1, wherein the first insulating layer further comprises another first opening disposed in the peripheral region, the second conducting layer comprises another first conductive portion, the another first conductive portion is electrically connected to the first conducting layer through the another first opening, and the first conductive portion and the another first conductive portion are not connected to each other along the second direction.

17. The adjusting device according to claim 16, wherein the another first opening is disposed corresponding to the first opening along the second direction.

18. The adjusting device according to claim 1, further comprising:
a second substrate disposed opposite to the first substrate, wherein the second substrate is adhered to and assembled with the first substrate through the sealant layer; and
a third conducting layer disposed on the second substrate and disposed between the second substrate and the sealant layer.

19. The adjusting device according to claim 18, wherein the sealant layer comprises a conductive particle, wherein the third conducting layer is electrically connected to the second conducting layer through the conductive particle.

20. The adjusting device according to claim 18, further comprising:
- a third insulating layer disposed on the third conducting layer, wherein the third insulating layer comprises a second opening;
- a fourth conducting layer disposed on the third insulating layer;
- a fourth insulating layer disposed on the fourth conducting layer, wherein the fourth insulating layer comprises a third opening communicating to the second opening of the third insulating layer, and a fourth opening;
- a fifth conducting layer disposed on the fourth insulating layer, wherein the fifth conducting layer is electrically connected to the third conducting layer through third opening and is electrically connected to the fourth conducting layer through the fourth opening,
- wherein the sealant layer is disposed between the second insulating layer and the fourth insulating layer.

* * * * *